US012537164B2

(12) United States Patent
Mizumura et al.

(10) Patent No.: US 12,537,164 B2
(45) Date of Patent: Jan. 27, 2026

(54) PROCESS APPARATUS INCLUDING DIFFERENTIAL PUMPING DEVICE AND FOCUSED ION BEAM COLUMN

(71) Applicant: V TECHNOLOGY CO., LTD., Yokohama (JP)

(72) Inventors: Michinobu Mizumura, Yokohama (JP); Toshinari Arai, Yokohama (JP); Takanori Matsumoto, Yokohama (JP); Takuro Takeshita, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 589 days.

(21) Appl. No.: 18/013,761

(22) PCT Filed: May 31, 2021

(86) PCT No.: PCT/JP2021/020647
§ 371 (c)(1),
(2) Date: Jul. 24, 2023

(87) PCT Pub. No.: WO2022/004230
PCT Pub. Date: Jan. 6, 2022

(65) Prior Publication Data

US 2023/0395353 A1 Dec. 7, 2023

(30) Foreign Application Priority Data

Jun. 29, 2020 (JP) ................................ 2020-111960

(51) Int. Cl.
*H01J 37/317* (2006.01)
*H01J 37/16* (2006.01)
(Continued)

(52) U.S. Cl.
CPC ............ *H01J 37/317* (2013.01); *H01J 37/16* (2013.01); *H01J 37/18* (2013.01); *H01J 37/244* (2013.01)

(58) Field of Classification Search
CPC .......... H01J 37/00; H01J 37/02; H01J 37/317; H01J 37/16; H01J 37/18; H01J 37/244;
(Continued)

(56) References Cited

U.S. PATENT DOCUMENTS

| | | | | |
|---|---|---|---|---|
| 5,103,102 A * | 4/1992 | Economou | H01J 37/18 | 427/586 |
| 2002/0088940 A1* | 7/2002 | Watanabe | H01J 37/224 | 250/310 |
| 2015/0083929 A1* | 3/2015 | Maazouz | H01J 37/21 | 250/398 |

FOREIGN PATENT DOCUMENTS

| | | |
|---|---|---|
| CN | 104919573 A | 9/2015 |
| JP | S59-093249 A | 5/1984 |

(Continued)

OTHER PUBLICATIONS

Office Action issued Jul. 21, 2025 for the corresponding Korean patent application No. 10-2022-7042580, with English machine translation, 6 pages.

(Continued)

*Primary Examiner* — Jason L Mccormack
(74) *Attorney, Agent, or Firm* — LUCAS & MERCANTI, LLP

(57) ABSTRACT

A process apparatus includes a differential pumping device having a head which has a plurality of annular grooves in a surface which faces a substrate to be processed. An orifice is formed inside an innermost one of the annular grooves and defines a processing space for processing the substrate. A vacuum pump is connected to at least one of the annular grooves to suck gas therefrom, with the surface of the head
(Continued)

facing the substrate processing surface to create a high-level vacuum in the processing space. A focused ion beam column is equipped with a cylindrical chamber leading to the orifice. The chamber has disposed therein a focused ion beam optical system which emits a focused ion beam through the orifice. A precursor gas supply connects to the innermost annular groove to eject a precursor gas to flow into the processing space along the process surface.

10 Claims, 14 Drawing Sheets

(51) Int. Cl.
*H01J 37/18* (2006.01)
*H01J 37/244* (2006.01)

(58) Field of Classification Search
CPC .......... H01J 37/26; H01J 37/28; H01J 37/165; H01J 37/3056; H01J 2237/006; H01J 2237/162; H01J 2237/188; H01J 2237/2811
USPC .............................. 250/492.3, 306, 307, 311
See application file for complete search history.

(56) References Cited

FOREIGN PATENT DOCUMENTS

| | | | |
|---|---|---|---|
| JP | 2006-225705 | A | 8/2006 |
| JP | 2007-19033 | A | 1/2007 |
| JP | 2008-112958 | A | 5/2008 |
| JP | 2008-123891 | A | 5/2008 |
| JP | 2008-166137 | A | 7/2008 |
| JP | 5114960 | B2 | 1/2013 |
| JP | 2014-157772 | A | 8/2014 |
| TW | 201946087 | A | 12/2019 |
| WO | 2014/112402 | A1 | 7/2014 |

OTHER PUBLICATIONS

Office Action dated Nov. 29, 2024, issued for the corresponding Chinese Patent Application No. 202180030902.8, 16 pages, with English translation.
Office Action dated on Nov. 21, 2024, issued for the corresponding Taiwan Patent Application No. 110120892, 6 pages, with English translation.
International Search Report (PCT/ISA/210) issued on Jul. 20, 2021, by the Japanese Patent Office as the International Searching Authority for International Application No. PCT/JP2021/020647. (5 pages).
Written Opinion (PCT/ISA/237) issued on Jul. 20, 2021, by the Japanese Patent Office as the International Searching Authority for International Application No. PCT/JP2021/020647. (3 pages).

* cited by examiner

PROCESS APPARATUS INCLUDING DIFFERENTIAL PUMPING DEVICE AND FOCUSED ION BEAM COLUMN

CROSS-REFERENCE TO RELATED APPLICATION

This application is a 35 U.S.C. 371 National Phase Entry Application of International Patent Application PCT/JP2021/020647, filed May 31, 2021, which claims priority to Japanese Patent Application No. 2020-111960, filed Jun. 29, 2020, the disclosures of which are incorporated herein in their entirety by reference, and priority is claimed to each of the foregoing.

FIELD OF THE INVENTION

The present invention relates generally to process apparatuses having differential pumping devices.

BACKGROUND

There is known a process apparatus which works to scan the surface of a specimen with a focused ion beam emitted from a focused ion beam column, capture secondary particles (e.g., secondary electrons, secondary ions) sputtered from the surface of the specimen which the focused ion beam bombards, and then provide a scanning ion microscopic image for use in observation of the surface of the specimen or formation of a film on the surface of the specimen. Specifically, the process apparatus is designed to have several functions, such as specimen observation, etching (sputtering), and chemical vapor deposition (CVD).

The above type of process apparatus is capable of emitting a focused ion beam to a required portion of the surface of a repair-required substrate using information derived from the scanning ion microscopic image and simultaneously delivering a CVD gas to the required portion from a supply nozzle arranged outside the focused ion beam column to locally form a thin film for processing or repairing the required portion.

In recent years, a process apparatus has been proposed which is equipped with a local exhaust ventilation system which works to locally create a vacuum space on the surface of a repair-required substrate without need of a large-sized vacuum chamber (see, for example, Patent Literature 1). The process apparatus is designed to have formed therein a precursor gas path which supplies a precursor gas directly to below an orifice in a head (i.e., a lower end) of a focused ion beam column (see FIG. 4 of Patent Literature 1).

PRIOR ART

Patent Literature

Patent Literature 1: JP 5114960 B2

SUMMARY OF THE INVENTION

Problems to be Solved

The above known process apparatus, however, faces a problem that it is difficult for the precursor gas directly supplied to the head of the focused ion beam column to reach the surface of the substrate to be processed, which leads to instability in forming a film on the surface of the substrate using CVD techniques.

The present invention was made in view of the above-mentioned problem. It is an object of the present invention to provide a process apparatus that is capable of forming a film on a substrate with high accuracy.

Means for Solving Problem

In order to solve the above-described problem and achieve the object, the present invention is to provide a process apparatus which comprises: (a) a differential pumping device including a head which faces a given area of a process surface of a substrate to be processed and has a plurality of annular grooves formed in a process surface-facing surface of the head which faces the process surface of the substrate, the annular grooves surrounding the center of the head, the head having an orifice which is formed inside an innermost one of the annular grooves and defines a processing space serving to achieve processing of the process surface, at least one of the annular grooves being connected to a vacuum pump to suck gas from the one of the annular grooves with the process surface-facing surface opposed to the process surface to create a high-level vacuum in the processing space; and (b) a focused ion beam column which is arranged on an opposite side of the head to the process surface-facing surface and includes a chamber leading to the orifice to be communicable with the processing space, the focused ion beam column also including a focused ion beam optical system which is disposed in the chamber and works to emit a focused ion beam through the orifice. A precursor gas supply is connected to the innermost one of the annular grooves to eject a precursor gas toward the process surface so that the precursor gas flows into the processing space along the process surface.

It is preferable in the above mode that the head includes a head body and a groove-forming plate attached to a surface of the head body which faces the substrate to be processed, and the surface of the groove-defining plate which faces the substrate to be processed is the process surface-facing surface.

It is also preferable in the above mode that the groove-defining plate is arranged in the form of islands within an outline of the surface of the head body which faces the substrate to be processed, and a shoulder of the head which is defined by the surface of the head body which faces the substrate and an outer periphery of the groove-defining plate is in a tapered shape.

Alternatively, it is preferable in the above mode that the groove-defining plate is arranged in the form of islands within an outline of the surface of the head body which faces the substrate to be processed, and a shoulder of the head which is defined by the surface of the head body which faces the substrate and an outer periphery of the groove-defining plate is shaped to have a rounded surface.

It is also preferable in the above mode that the groove-defining plate includes a plurality of annular plates arranged around the center of the head.

It is also preferable in the above mode that a microchannel plate is disposed which has a beam output orifice which is formed in a nose of the chamber and through which the focused ion beam passes. The microchannel plate has a portion which lies around the beam output orifice and serves as a detector to capture secondary charged particles sputtered from the substrate.

It is also preferable in the above mode that an optical microscope is also provided which detects an alignment mark formed on the substrate.

It is also preferable in the above mode that an observation microscope is also provided which is arranged at a given offset-distance away from the head and works to observe a given region of the substrate to be processed.

It is also preferable in the above mode that the focused ion beam column includes a plurality of focused ion beam columns each of which has the differential pumping device mounted on a nose thereof, each of the focused ion beam columns being arranged to face a respective one of a plurality of regions defined on the process surface of the substrate.

It is also preferable in the above mode that the focused ion beam column equipped with the differential pumping device is arranged to be movable in X- and Y-directions relative to the substrate which is fixed.

Technical Effect

The present invention is capable of realizing a process apparatus which is configured to ensure the stability in performing a film-forming operation on a substrate.

DETAILED DESCRIPTION

Process apparatuses according to embodiments of the present invention will be described below in detail with reference to the accompanying drawings. It should be noted that the drawings are schematic, so that the dimension, ratio, number, and shape of each element differ from those of the real element. In addition, there are parts or portions in which the dimensional relationship, ratio, and shape are different among the drawings.

First Embodiment (Structure of Process Apparatus)

Figure 1:
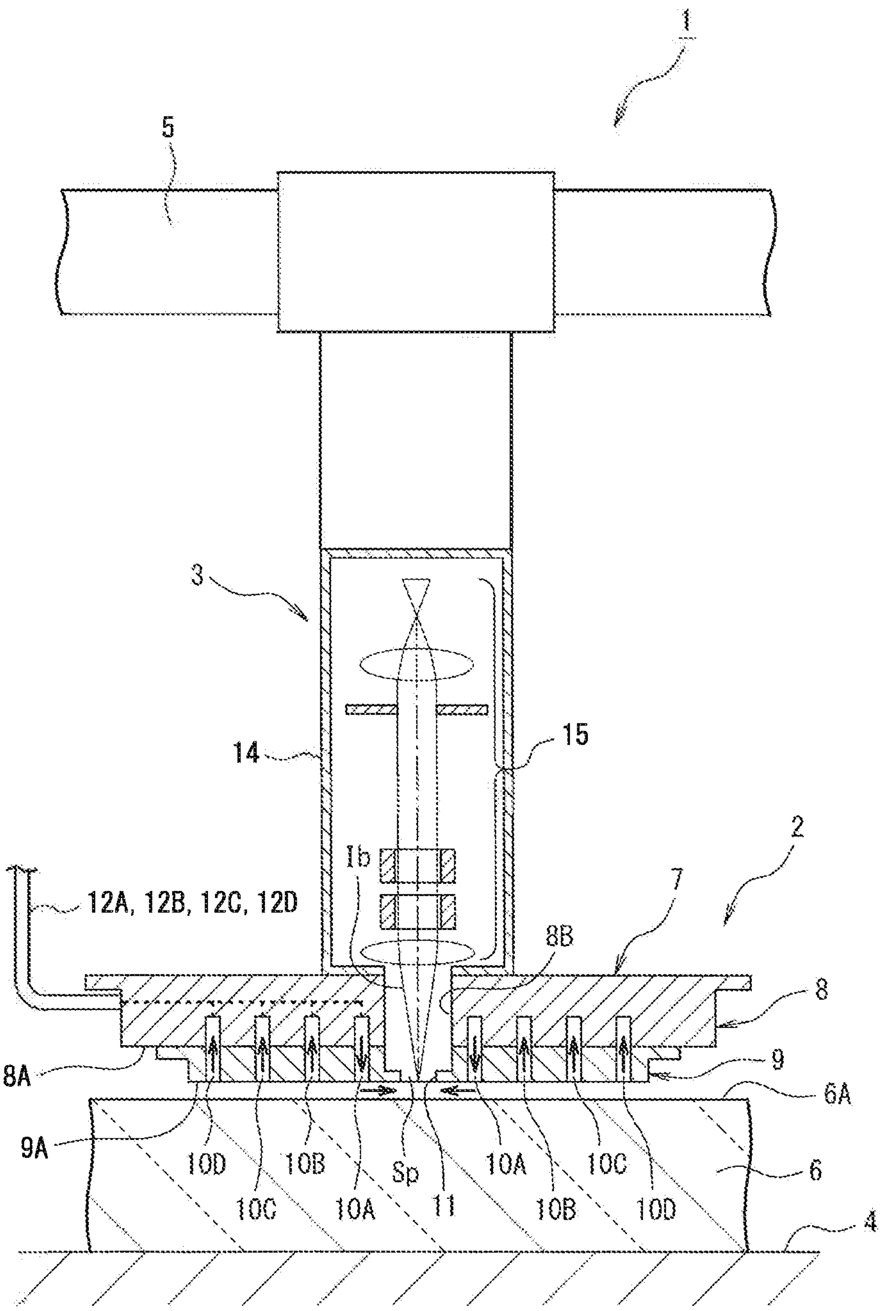
FIG. 1 is an explanatory sectional view of a process apparatus according to the first embodiment of the present invention.

FIG. 1 schematically shows the structure of the process apparatus 1 according to the first embodiment. The process apparatus 1 includes the differential pumping device 2, the focused ion beam column (hereinafter also referred to as an FIB column) 3, the substrate support 4, and the support frame 5. The substrate support 4 is configured to support thereon the photomask 6 that is a substrate to be processed. The substrate support 4 is designed in the form of an XY stage which is movable along X and Y axis.

Structure of Differential Pumping Device

Figure 2:
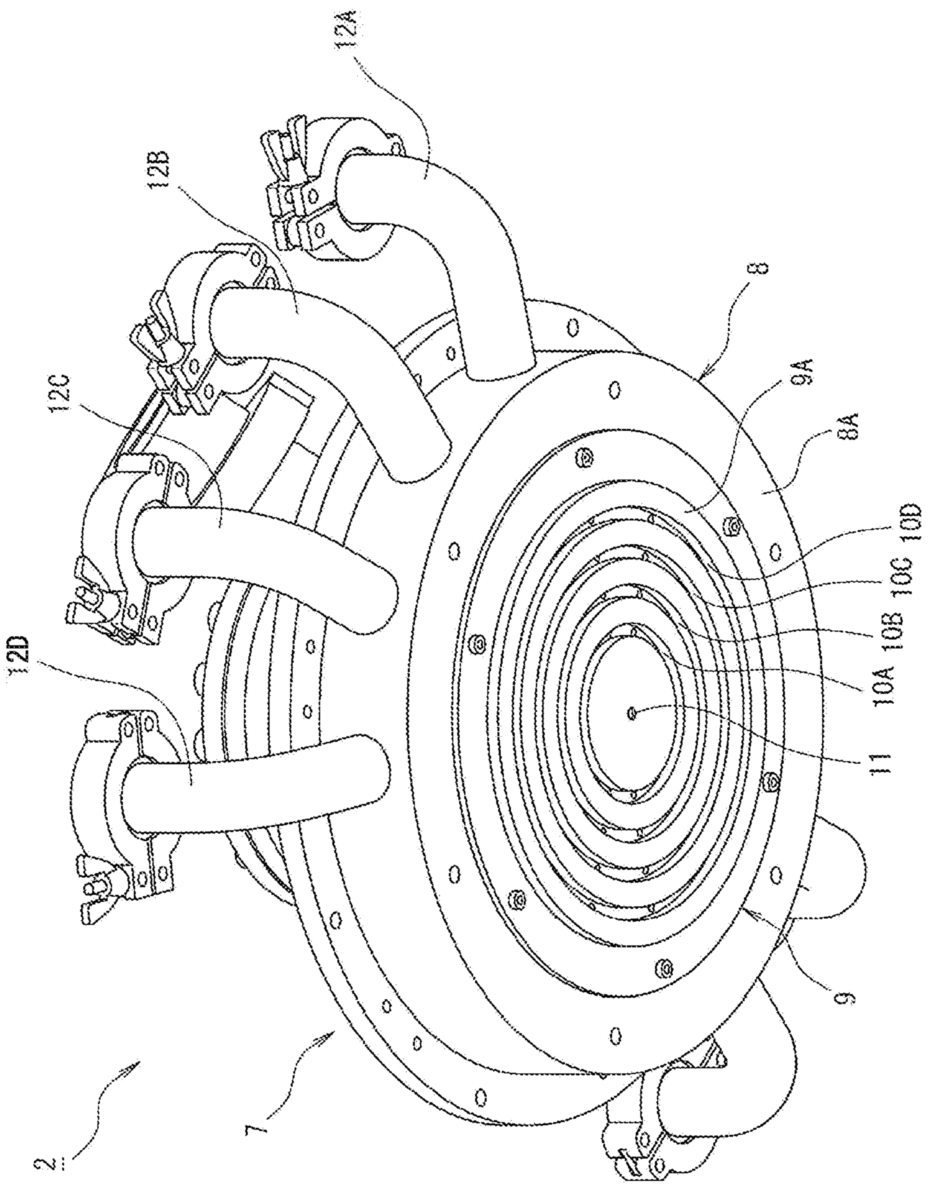
FIG. 2 is a perspective view of a differential pumping device, as viewed obliquely from below, which constitutes a process apparatus according to the first embodiment of the present invention.
Figure 3:
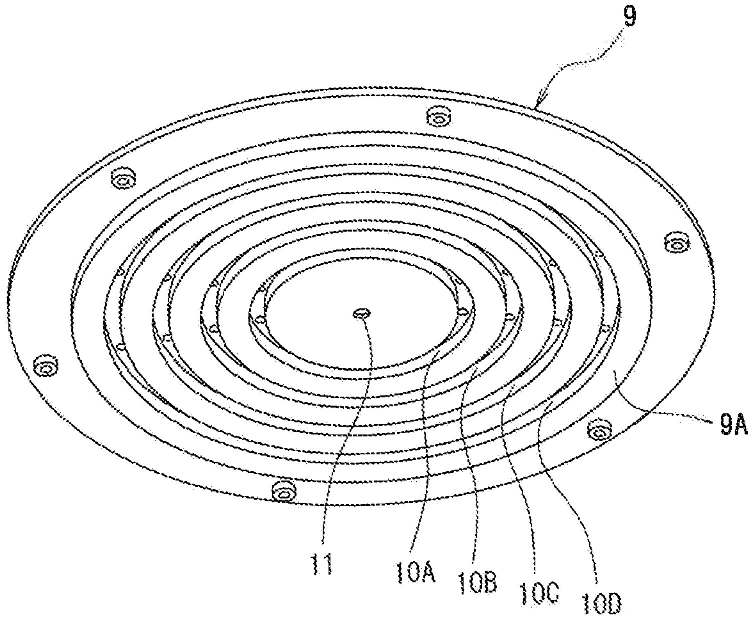
FIG. 3 is a perspective view of a groove-defining plate, as viewed obliquely from below, which constitutes a process apparatus according to the first embodiment of the present invention.
Figure 4:
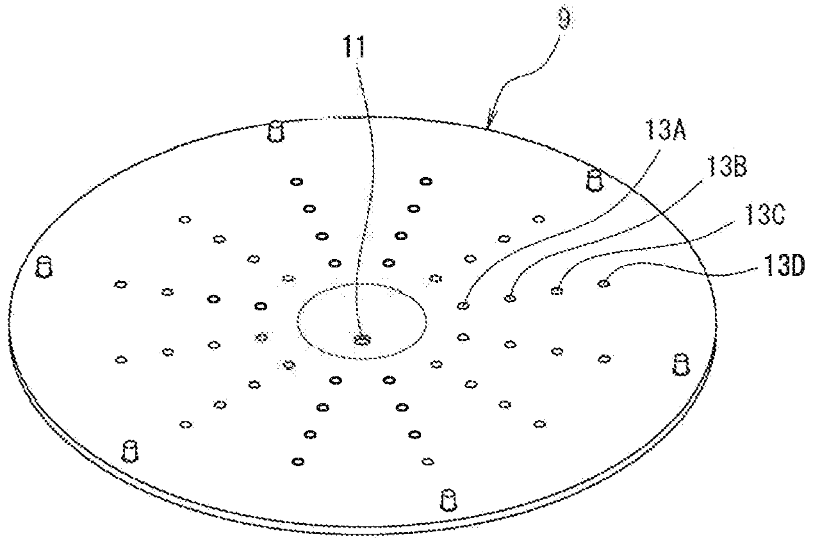
FIG. 4 is a perspective view of the groove-defining plate, as viewed obliquely from above, which constitutes a process apparatus according to the first embodiment of the present invention.

The configuration of the differential pumping device 2 will be described below with reference to FIGS. 2 to 4. FIG. 2 is a perspective view of the differential pumping device 2, as viewed from below. The differential pumping device 2 includes the head 9, a vacuum pump, and a delivery pump, which pumps are not shown.

The head 7 is composed of two disc-shaped metal plates which are much smaller in area than the process surface 6A of the photomask 6 to be processed. The substrate support 4 is moveable in "X" and "Y" direction to orient the head 7 to face any area of the process surface 6A to be processed.

As shown in FIGS. 1 and 2, the head 7 includes the head body 8 and the groove-defining plate 9 attached to the surface 8A of the head body 8 which faces the photomask 6. The groove-defining plate 9 is placed in the form of islands within an outline of the surface 8A of the head body 8 which faces the photomask 6. In this embodiment, the groove-defining plate 9 is attached to the head body using screws, but however, another type of fasteners may alternatively be used. The groove-defining plate 9 has the process surface-facing surface 9A which directly faces the photomask 6.

As shown in FIG. 2, the process surface-facing surface (i.e., lower surface) 9A of the head 9 has formed therein four annular grooves 10A, 10B, 10C, and 10D which surround the center of the head 7. The head 7 has the orifice 11 formed in a portion thereof which lies inside the annular groove 10A that is an innermost one of the annular grooves 10A, 10B, 10C, and 10D. The orifice 11 defines therein the processing space Sp. The orifice 11 enables the process surface 6A of the photomask 6 to be processed, e.g., exposed to a focused ion beam to form a film thereon. The head body 8 has formed in the center thereof the orifice 8B which connects with the orifice 11. In this disclosure, each of grooves surrounding the center of the head 7 is referred to as an annular groove, but the annular grooves include circular looped grooves, rectangular looped grooves, C-shaped grooves each of which has a portion omitted, or grooves each of which is defined by a plurality of discrete segments arranged intermittently in the form of a loop.

The cylindrical chamber 14 of the FIB column 3, which will be described later, is, as illustrated in FIG. 1, connected to the orifice 8B in communication therewith. The head body 8 also has formed therein communication paths each of which communicates with a respective one of the annular grooves 10A, 10B, 10C and 10D of the groove-defining plate 9. The connecting pipes 12A, 12B, 12C, and 12D are connected to the communication paths, respectively. In this embodiment, the groove-defining plate 9, as illustrated in FIGS. 3 and 4, has a plurality of communication holes 13A, 13B, 13C, and 13D which are formed in the bottoms of the annular grooves 10A, 10B, 10C, and 10D and extend through the thickness of the groove-defining plate 9. The annular grooves 10A, 10B, 10C, and 10D communicate with the communication paths in the head body 8 through the communication holes 13A, 13B, 13C, and 13D.

At least one (three in this embodiment) of the annular grooves 10A, 10B, 10C, and 10D, e.g., the annular grooves 10B, 10C, and 10D are connected to the connecting pipes 12B, 12C, and 12D through the communication paths formed inside the head body 8. The connecting pipes 12B, 12C, and 12D are connected to a vacuum pump (not shown).

The innermost annular groove 10A is connected to a precursor gas supply, not shown, which is a supply source of a deposition gas (e.g., a precursor gas or a CVD gas) through the connecting pipe 12A. When the process surface-facing surface 9A of the head 7 is oriented to face the process surface 6A to be processed, the head 7 is capable of functioning to suck air from the annular grooves 10B, 10C, and 10D to create a high vacuum within the processing space Sp. The head 7 also ensures a reliable supply of the precursor gas to the processing space Sp, which is highly vacuumized in the above manner, from the innermost annular groove 10A to achieve CVD formation of a film on the process surface 6A to be processed which faces the orifice 11.

Incidentally, a conventional process apparatus is designed to have an outlet of a precursor gas path in a local exhaust ventilation system which is arranged adjacent to an orifice in a head of a chamber of a focused ion beam column and thus encounters a problem that a CVD-produced material is easy to deposit on the wall near the outlet of the precursor gas path. Specifically, the CVD-produced material deposits near the head of the chamber, so it might have a negative influence on the focused ion beam. In order to get rid of such negative influence, the local exhaust ventilation system requires maintenance in the conventional process apparatus. In the actual field, it is necessary to frequently clean the deposited CVD-produced materials following the removal of the local exhaust ventilation system from the focused ion beam column. This leads to an issue that it takes personnel a long time to detach, clean, and install the exhaust ventilation system because the local exhaust ventilation system has exhaust pipes and precursor gas supply pipes connected thereto.

In the conventional process apparatus, since the gap between the local exhaust ventilation system and the substrate to be repaired is as narrow as about 40 μm, there is a possibility that the lower surface of the local exhaust ventilation system may contact the substrate to be repaired and need to be replaced. Even in such replacement, there is a problem that it takes a long time and a lot of management cost.

Focused Ion Beam (FIB) Column

The FIB column 3 is disposed on a surface (i.e., an upper surface) of the head 7 which faces away from the process surface-facing surface 9A of the head 7 and has a top opening communicating with the orifice 8B and 11 of the head 7.

The FIB column 3 includes the chamber 14 communicating with the processing space Sp and the focused ion beam optical system 15 built in the chamber 14. The FIB column 3 is configured to emit the focused ion beam Ib from the top thereof. The focused ion beam Ib passes through the orifice 11. The FIB column 3 is supported by the support frame 5 in a suspended state.

The focused ion beam system 15 includes an ion source which generates the ion beam Ib, an electrostatic condenser lens which collimates the ion beam Ib, an electric field deflector which steers or scans the ion beam Ib, an objective electrostatic lens which focuses the ion beam Ib. The ion source is implemented by a gallium (Ga) ion source, but, noble gas ion source, using an inductively coupled plasma (ICP) with noble gas like argon (Ar) or gas electrolytic ionization, may be used. Field lenses are good as the lenses for the ion beam Ib.

Tungsten hexacarbonyl ($W(CO)_6$) may be used as a deposition gas for CVD. When the focused ion beam is emitted to the tungsten hexacarbonyl $W(CO)_6$ near a substrate, it will cause the tungsten hexacarbonyl $W(CO)_6$ to be decomposed into W and CO, leading to deposition of W on the substrate.

Operation of Process Apparatus According to First Embodiment

In a processing operation of the process apparatus 1 in this embodiment, the process surface 6A of the photomask 6 is first placed to face the process surface-facing surface 9A of the head 7 and extend parallel to the process surface-facing surface 9A with a predetermined gap therebetween.

Subsequently, a vacuum pump (not shown) is activated to suck air from the three annular grooves 10B, 10C and 10D through the connecting pipes 12B, 12C, and 12D. This causes the processing space Sp defined by the orifice 11 arranged inside the innermost annular groove 10A to be evacuated to a high vacuum due to the suction action through the annular grooves 10B, 10C, and 10D.

In the state of a high vacuum created within the processing space Sp, a precursor gas (i.e., gas for CVD) is supplied to the innermost annular groove 10A through the connecting pipe 12A from a precursor gas supply (not shown). The innermost annular groove 10A is in the vicinity of the processing space Sp, and so the precursor gas reaches the processing space Sp without any fail. The precursor gas moves along the process surface 6A of the photomask 6 toward the processing space Sp until it lies underneath the processing space Sp. In other words, the precursor gas exists stably in the area where the film is to be formed.

In the above state, when the FIB column 3 emits the ion beam Ib toward the processing space Sp, it causes the thin film to be formed by the CVD techniques on the area of the process surface 6A which faces the orifice 11.

Technical Effect Provided by Process Apparatus According to First Embodiment

In the process apparatus 1 according to the present embodiment, the differential pumping device 2 is capable of locally creating a high vacuum, thereby eliminating the need to place the whole of the process surface 6A of the photomask 6 in a vacuum.

In the differential pumping device 2 of this embodiment, the precursor gas supply is connected to the innermost annular groove 10A. By discharging the precursor gas from the innermost annular groove 10A toward the process surface 6A of the photomask 6, the precursor gas reaches the processing space Sp from the orifice 11 through the process surface 6A to be processed. This ensures the stability of the precursor gas to reach the area of the process surface 6A which is exposed to the processing space Sp to form a thin film of excellent quality by focused ion beam Ib using the CVD techniques.

Moreover, in this embodiment, the groove-defining plate 9 is easily detachable from the head body 8 and replaceable with a new one, making it unnecessary to detach the FIB column 3 and the connecting pipes 12A, 12B, 12C, and 12D, making the maintenance easy.

Modification 1 of First Embodiment

Figure 5:
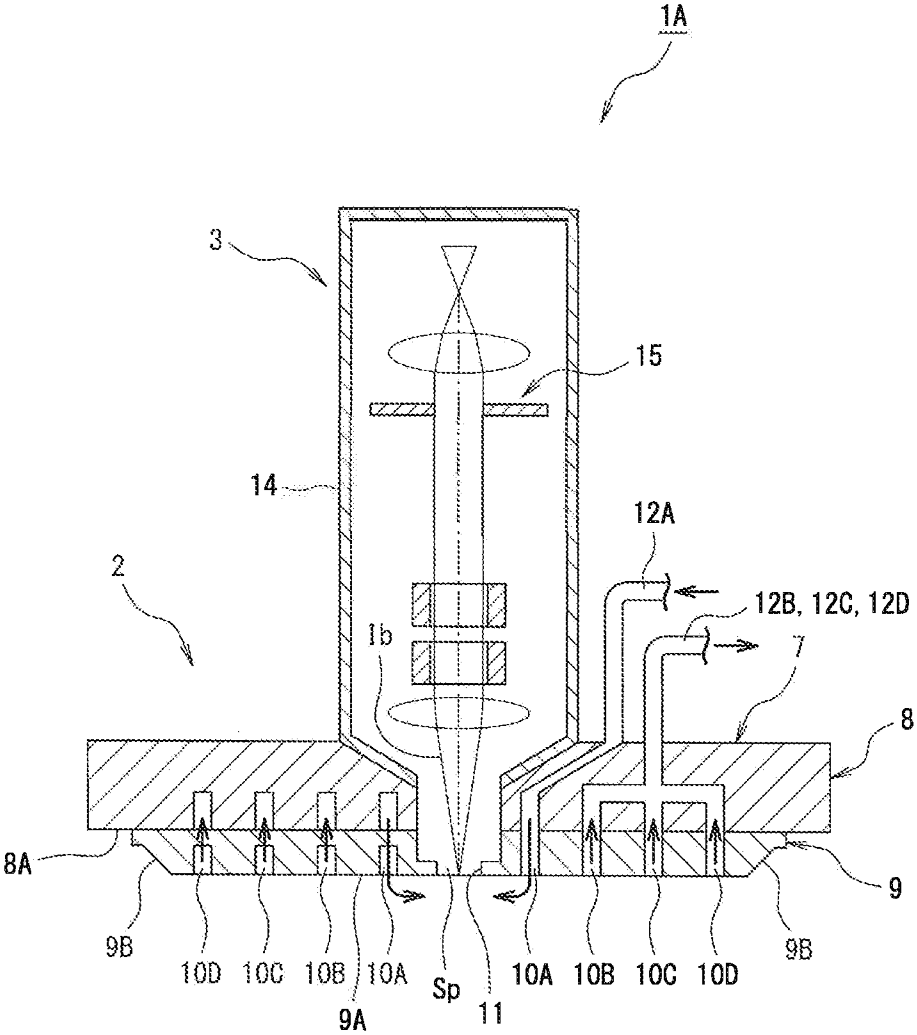
FIG. 5 is an explanatory sectional view of a process apparatus implementing a modification 1 of the first embodiment of the present invention.

The process apparatus 1A shown in FIG. 5 implements a modification 1 of the process apparatus 1 according to the above-described first embodiment. The process apparatus 1A is designed to have the tapered surface 9B that is an outer peripheral surface of the groove-defining plate 9 of the head 7, in other words, an outer peripheral surface (i.e., a wall surface) of a shoulder defined by the surface 8A of the head body 8 and the outer periphery of the groove-defining plate 9. Other arrangements of the process apparatus 1A are identical with those in the process apparatus 1 in the first embodiment, so that the process apparatus 1A works in the same way as in the first embodiment, thus offering substantially the same beneficial advantages as those in the first embodiment.

When the gap between the process surface-facing surface 9A of the differential pumping device 2 and the process surface 6A of the photomask 6 is selected to be as small as about 40 μm, it may cause a turbulence flow to be created in the gap which triggers the occurrence of vibrations. In the modification 1, the outer periphery of the groove-defining plate 9 is shaped to have the tapered surface 9B with no sharp shoulder, thereby minimizing the risk of occurrence of the turbulence flow and thus reducing the occurrence of vibrations.

Modification 2 of First Embodiment

Figure 6:
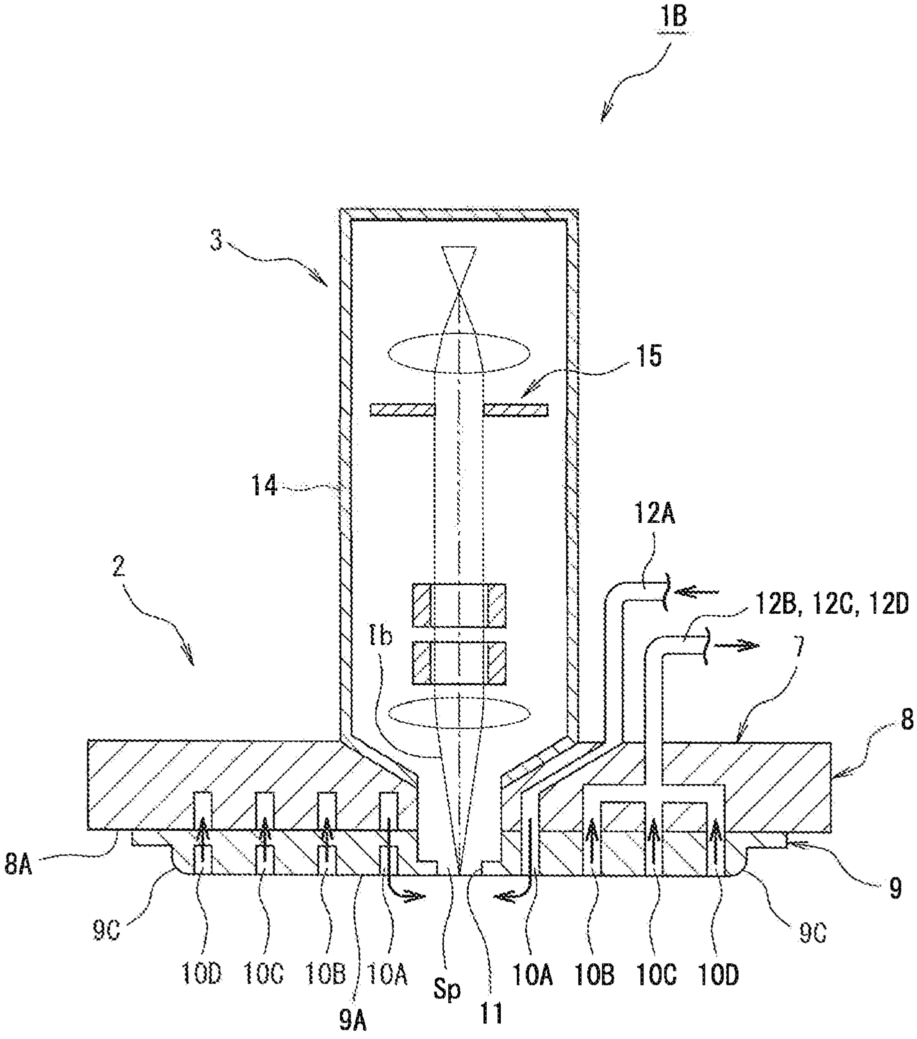
FIG. 6 is an explanatory sectional view of a process apparatus implementing a modification 2 of the first embodiment of the present invention.

FIG. 6 shows the process apparatus 1B implementing a modification 2 of the first embodiment. The process apparatus 1B has the groove-forming plate of the head 7 which is shaped to have an outer peripheral shoulder curved to define the rounded surface 9C. Other arrangements of the process apparatus 1B are identical with those in the process apparatus 1 in the first embodiment.

In the modification 2, the outer shoulder of the groove-defining plate 9 is shaped to have the rounded surface 9C which, like the modification 1, alleviates the risk of occurrence of a turbulence flow between the process surface-facing surface 9A and the process surface 6A to reduce the mechanical vibration of the process apparatus 1B. The modification 2 is identical in operation of the process apparatus 1B with the first embodiment and offers substantially the same beneficial advantages as those derived by the process apparatus 1 in the first embodiment.

Modification 3 of First Embodiment

Figure 7:
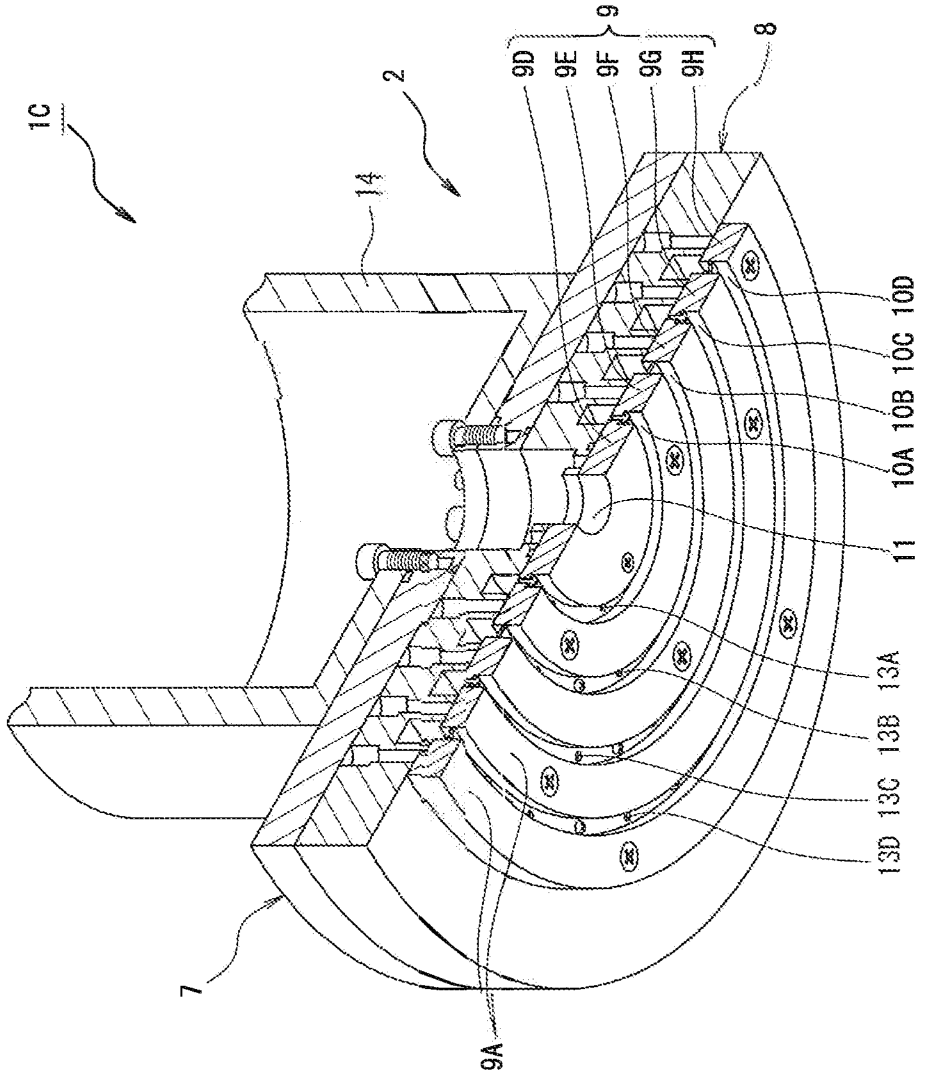
FIG. 7 is a partial perspective sectional view of a process apparatus, as viewed obliquely from below, which implements a modification 3 of the first embodiment of the present invention.

FIG. 7 is a partial sectional perspective view which illustrates the process apparatus 1C implementing a modification 3 of the first embodiment. In the modification 3, the groove-defining plate 9 is made up of five discrete annular plates 9D, 9E, 9F, 9G, and 9H which are arranged concentrically. The annular plates 9D, 9F, 9G, and 9H define the annular grooves 10A, 10B, 10C, and 10D, each between a respective adjacent two thereof. Other arrangements of the process apparatus 1C are identical with those in the process apparatus 1 in the first embodiment.

The modification 3 is capable of slightly altering the thickness of each of the annular plates 9D, 9E, 9F, 9G, and 9H of the groove-defining plate 9 to regulate the differential pumping operation and also enables only damaged one or more of the annular plates 9D, 9E, 9F, 9G, and 9H to be replaced with a new one(s). This results in a decrease in maintenance cost and facilitates the ease of removal or replacement of each of the annular plates 9D, 9E, 9F, 9G, and 9H.

Second Embodiment

Figure 8:
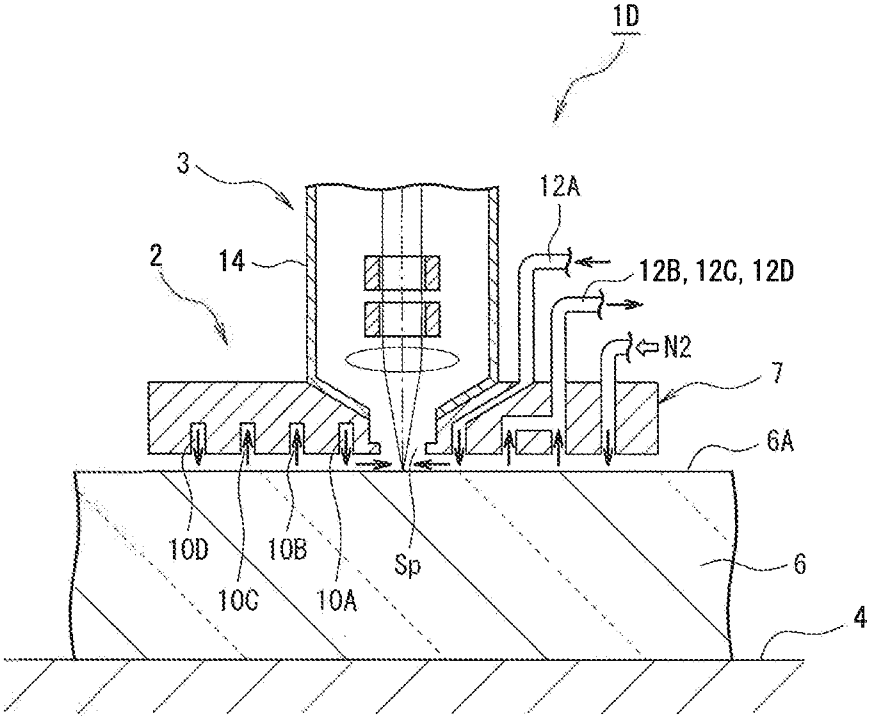
FIG. 8 is a sectional view illustrating a major part of a process apparatus according to the second embodiment of the present invention.

FIG. 8 is a cross-sectional view which illustrates highlights of the process apparatus 1D according to the second embodiment. In this embodiment, inert gas in the form of nitrogen gas (N2) is sprayed through the outermost annular groove 10D of the head 7 onto the process surface 6A to be processed, creating a curtain of inert gas. Using the inert gas in this way makes it possible to purge the inside of the chamber 14 with the inert gas, contributing to reduction in particles or other contaminations. Further, the process apparatus 1D is effective to use the spraying of inert gas to cancel the vacuum pressure arising from the differential pumping operation. In this embodiment, the head 7 is composed of a single metal plate.

Modification 1 of Second Embodiment

Figure 9:
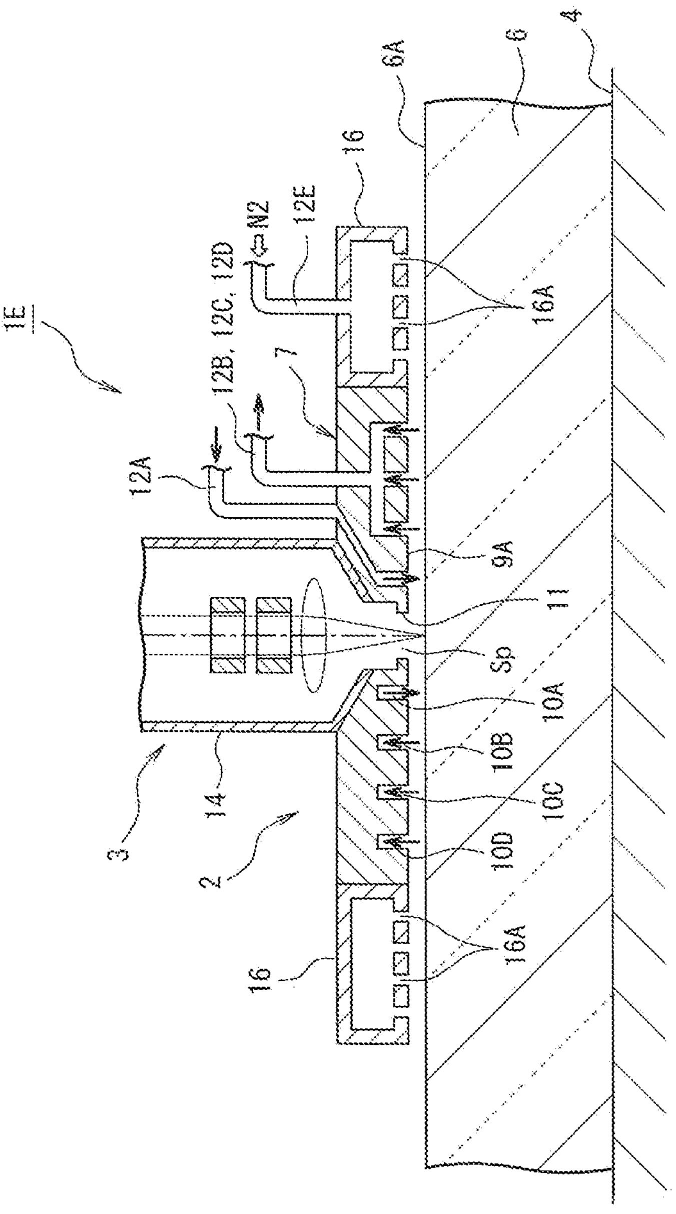
FIG. 9 is an explanatory view which schematically illustrates a process apparatus implementing a modification 1 of the second embodiment of the present invention.

FIG. 9 is an explanatory sectional view which illustrates the process apparatus 1E implementing a modification 1 of the second embodiment. The process apparatus 1E is, as illustrated in FIG. 9, equipped with the air float pad 16 arranged outside the process surface-facing surface 9A of the head 7 of the differential pumping device 2. The air float pad 16 extends along the entire peripheral edge of the process surface-facing surface 9A integrally therewith. The air float pad 16 is connected to a delivery pump (not shown) using the connecting pipe 12E. The delivery pump works to supply a nitrogen gas (N2) that is an inert gas. The air float pad 16 is in the shape of a flattened annular pipe and has a plurality of slit-shaped or circular openings 16A from which inert gas is ejected. Other arrangements of the process apparatus 1D are identical with those in the process apparatus 1D in the second embodiment.

The air float pad 16 ejects inert gas to the process surface 6A to be processed to create a gaseous curtain. This causes the air float pad 26 to bias the head 9 away from the process surface 6A. The use of inert gas in this way enables the inside of the chamber 14 to be purged with the inert gas, which contributes to reduction in particles or other contaminations. The ejection of inert gas on the process surface 6A also cancels the vacuum pressure arising from the differential pumping operation.

Third Embodiment

Figure 10:
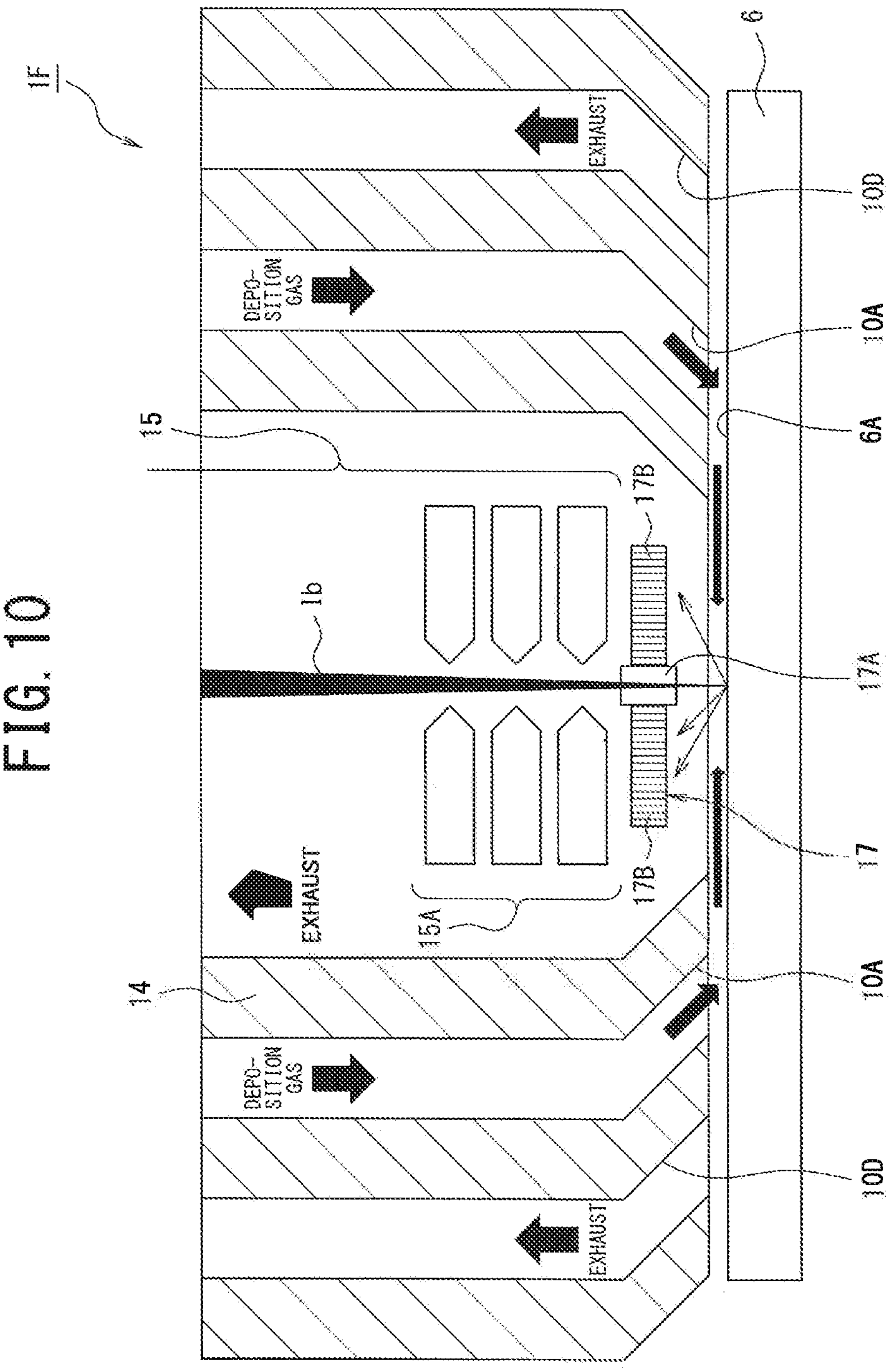
FIG. 10 is a sectional view which illustrates a major part of a process apparatus according to the third embodiment of the present invention.

FIG. 10 is an explanatory view which schematically shows the process apparatus 1F according to the third embodiment of the present invention. The process apparatus 1F has, within the nose of the chamber 14, the objective electrostatic lens 15A of the focused ion beam optical system 15 and the microchannel plate 17. The microchannel plate 17 is located downstream of the objective electrostatic lens 15A with respect to the flow of an ion beam (i.e., near the top end of the chamber 14). The microchannel plate 17, as illustrated in FIG. 10, has the ion beam output orifice 17A formed through its center. The microchannel plate 17A also has a portion which lies around the ion beam output orifice 17A and serves as the detector 17B to capture secondary charged particles P sputtered from the photomask 6.

When it is required to observe the process surface 6A of the photomask using the process apparatus 1F, the focused ion beam Ib is emitted while suspending the supply of deposition gas (i.e., precursor gas). The focus ion beam Ib then passes through the ion beam output orifice 17A and bombards the process surface 6A to be processed. This causes secondary charged particles P sputtered from the process surface 6A to enter the detector 17B to create electrons. The electrons generated in this way may be amplified using avalanche current to derive information about the condition of the process surface 6A. The process apparatus 1F in this embodiment is, therefore, capable of measuring the condition of the process surface 6A with a high sensitivity.

The process apparatus 1F according to this embodiment is capable of shortening the working distance (WD) of the objective electrostatic lens 15A, thereby improving the efficiency in capturing the secondary charged particle P as compared to the conventional method for detecting secondary charged particles with a scintillator which is arranged away from a focused ion beam optical system within a vacuum chamber.

If the working distance of the objective electrostatic lens 15A to the substrate 8 is too short, it becomes more difficult to place a structural element, such as a deposition gas (precursor gas) nozzle, near the tip of the chamber 14. In this embodiment, however, the annular groove 10A works to discharge deposition gas to an area of the process surface 6A located near the orifice 11, thereby directing the deposition gas to the processing space Sp through the process surface 6A to be processed. This embodiment is, therefore, free from the problem that the deposition gas supply becomes difficult if the working distance is shortened. This embodiment ensures high-quality and stable deposition with CVD because the precursor gas reaches the area of the process surface 6A which faces the processing space Sp without fail.

This embodiment, as described above, shortens the working distance of the objective electrostatic lens 15A, thereby improving the focusing efficiency of the focused ion beam optical system 15, which enables the focused ion beam optical system 15 to emit a finely focused ion beam Ib.

Further, this embodiment makes it unnecessary to alter the position of the photomask 6 because the positions of the photomask 6 in the observation mode for observing the condition of the process surface 6A and in the deposition mode for forming a film with CVD are the same. This eliminates a risk that the position of an area to be processed may shift undesirably as the photomask 6 moves.

Fourth Embodiment

Figure 11:
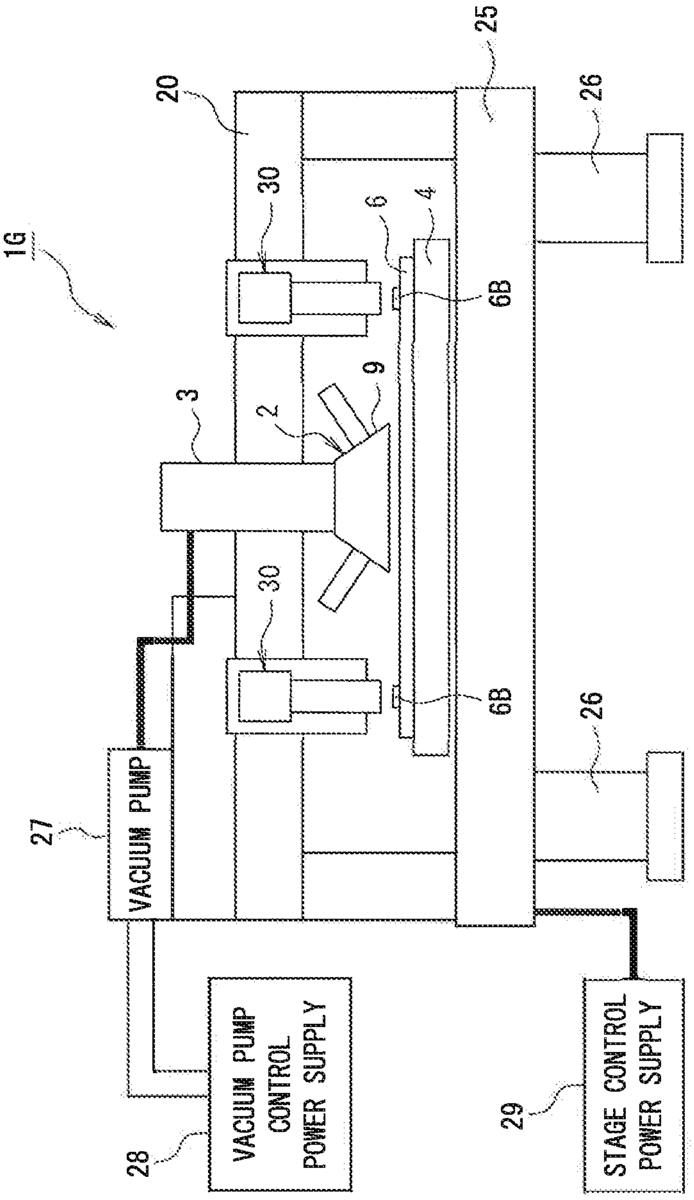
FIG. 11 is an explanatory view which illustrates a process apparatus according to the fourth embodiment of the invention.

FIG. 11 shows the process apparatus 1G according to the fourth embodiment of the invention. The processing device 1G includes the XY precision stage 25. The XY precision stage 25 has, underneath at least four corners, the support legs 26. The substrate support 4 that is driven by the XY precision stage 25 to move in the X and Y axis directions is put on the XY precision stage 25. The photomask 6 is placed on the substrate support 4.

The support frame 20 is, as shown in FIG. 11, built on the XY precision stage 25. The support frame 20 suspends the FIB column 3 at the center thereof. The differential pumping device 2 is arranged on the bottom end of the FIB column 3 integrally therewith. The structures of the FIB column 3 and the differential pumping device 2 are substantially identical with those in process apparatus 1 of the first embodiment.

The vacuum pump 27 is connected to the FIB column 3. The vacuum pump control power supply 28 is connected to the vacuum pump 27. The stage control power supply 29 is connected to the XY precision stage 25.

Particularly, this embodiment has the optical alignment microscopes 30 each of which is located above a respective one of the alignment marks 6B arranged on four corners of the photomask 6 placed at a given position on the XY precision stage 25.

According to this embodiment, the alignment microscopes are easy to install because the differential pumping device 2 has realized a localized vacuum space, and so the pressure outside the area to be processed is the atmospheric pressure. This embodiment is capable of achieving alignment of the photomask 6 with the optical alignment microscopes 30 using the alignment marks 6B on the four corners of the photomask 6 to determine coordinates of the photomask 6 based on a relative relationship of the positions of the optical alignment microscopes 30 with a location where the processing is conducted by the FIB column 3.

For the foregoing reasons, the process apparatus 1G according to this embodiment makes it unnecessary to move the XY precision stage 25 for the alignment. Moreover, the process apparatus 1G is effective in reducing the amount of positioning time for the alignment.

Fifth Embodiment

Figure 12:
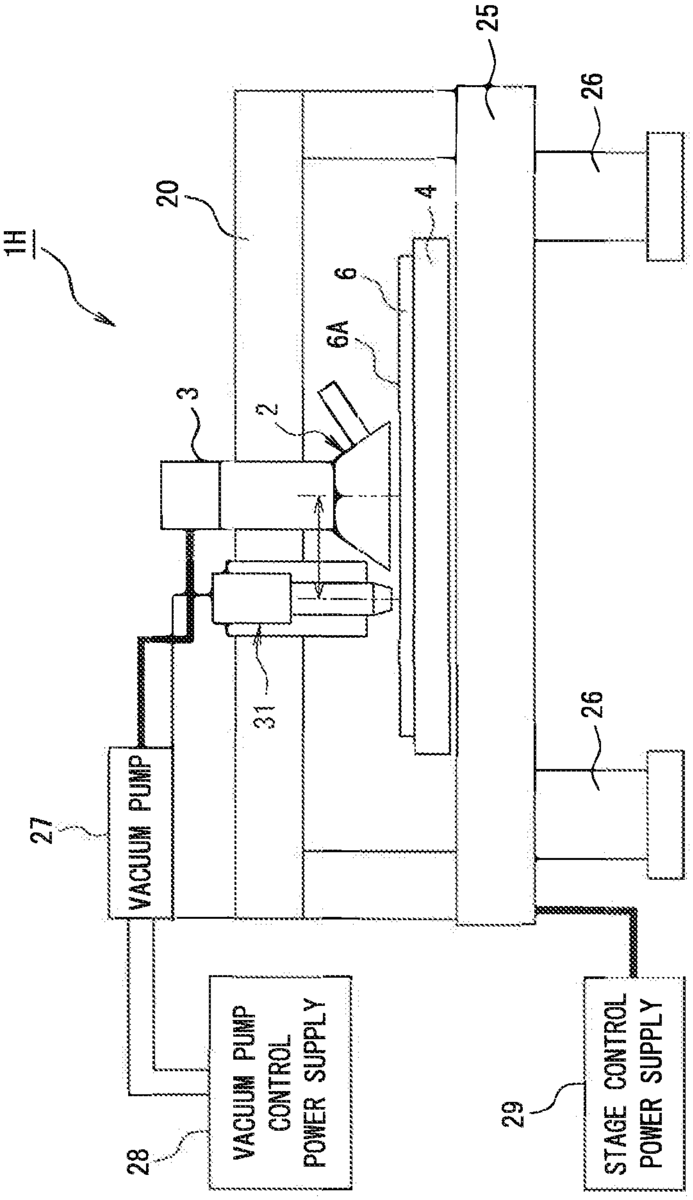
FIG. 12 is an explanatory view which illustrates a process apparatus according to the fifth embodiment of the invention.

FIG. 12 shows the process apparatus 1H according to the fifth embodiment of the present invention. The process apparatus 1H has the optical microscope 31 which is installed with an offset-distance to the FIB column 3. Although, in this embodiment, the optical alignment microscopes 30 used in the process apparatus 1G of the fourth embodiment are not installed, they may be added.

In the conventional process apparatus, secondary electrons or secondary ions sputtered from a photomask irradiated with a focused ion beam are captured by a charged-particle detector arranged outside the FIB column. Changes in intensity of the secondary electrons or secondary ions are used to observe the surface configuration of a process-required substrate in the form of ion images. Usually, the ion images are used to check an ion beam-emitting location. The secondary charged particles, however, depend upon the surface configuration (i.e., angle of inclination) of the process-required substrate, so that only the surface configuration is detected in the form of ion images. For this reason, in a case of the surface configuration with less irregularities, ion images with low contrast will be generated, which may result in a difficulty in confirming the ion beam-emitting location, which leads to a drop in positioning accuracy.

The process apparatus 1H according to this embodiment is, as illustrated in FIG. 12, capable of locally creating a high level of vacuum using the differential pumping device 2, thereby eliminating the need for placing the whole of the photomask 6 within a vacuum. This enables the optical microscope 31 to be installed near the FIB column 3. It is, therefore, possible for the high-resolution optical microscope 31 to derive information about the color of the process surface 6A of the photomask 6 to be processed using a focused ion beam as well as irregularities of the process surface 6A. For this reason, this embodiment makes it easy to confirm the position of an area of the photomask 6 which is required to be irradiated with a focused ion beam. This embodiment may alternatively use a laser microscope instead of the optical microscope 31.

By determining the offset of the ion beam-emitting location from the position of the photomask 6 derived by the optical microscope 31 in advance, the photomask 6 may be placed at the ion beam-emitting location immediately after the position of a process-required area of the photomask 6 is calculated using an optical image of the process-required area. As apparent from the above discussion, this embodiment is capable of determining the ion beam-emitting location even when the surface of the photomask 6 has less irregularities.

Sixth Embodiment

Figure 13:
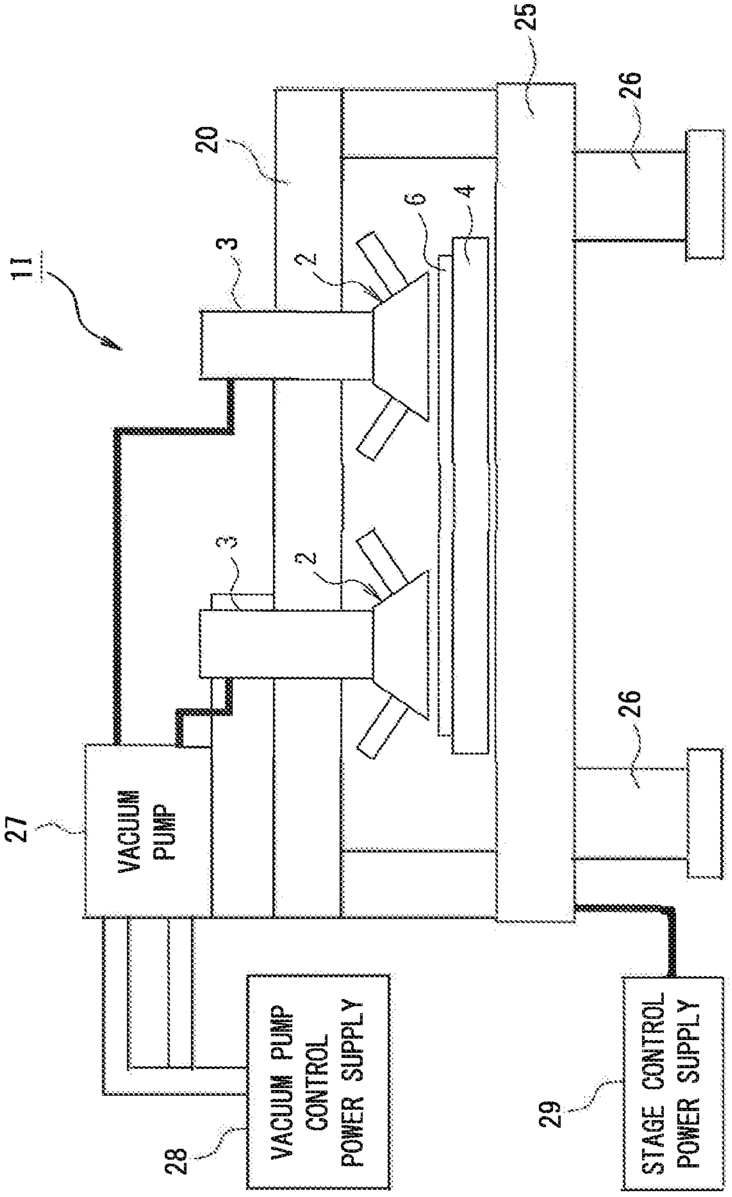
FIG. 13 is an explanatory view which illustrates a process apparatus according to the sixth embodiment of the invention.

FIG. 13 shows the process apparatus 1I according the sixth embodiment of the present invention. The process apparatus 1I includes the XY precision stage 25, the support legs 26 attached to at least four lower corners of the XY precision stage 25, the substrate support 4, the support frame 20, the four FIB columns 3 suspended from the support frame 20, and the differential pumping devices 2 each of which is mounted on a respective one of lower ends of the FIB columns 3.

Each of the FIB columns 3 is coupled to the vacuum pump 27 to which the vacuum pump control power supply 28 is connected. The stage control power supply 29 is connected to the XY precision stage 25.

In particular, this embodiment has the four FIB columns 3 each of which is aligned with a respective one of four regions defined on the photomask 6. Use of the single FIB column 3 for the single photomask 6 requires movement of the substrate support 4 by a distance of four times an area of the substrate (i.e., the photomask 6). In contrast, this embodiment has the four FIB columns 3, thereby resulting in a decrease in distance the substrate support 4 is required to be moved by the XY precision stage 25, which leads to a decrease in footprint of the process apparatus 1I.

Seventh Embodiment

Figure 14:
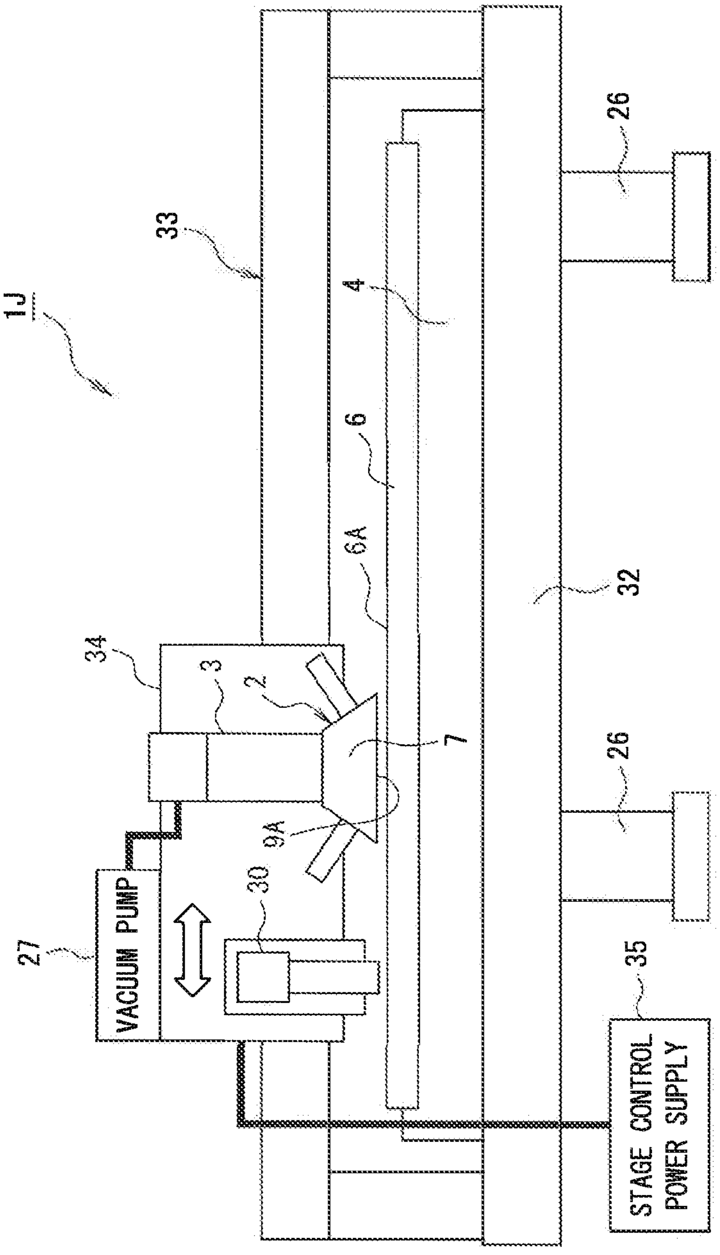
FIG. 14 is an explanatory view which illustrates a process apparatus according to the seventh embodiment of the invention.

FIG. 14 shows the process apparatus 1J according to the seventh embodiment of the present invention. The process apparatus 1J includes the substrate stage 32 to which the substrate support 4 is firmly secured. The substrate stage 32 has the support legs 26 attached to at least four lower corners thereof.

The XY gantry stage 33 is, as shown in FIG. 14, mounted on the substrate stage 32. The gantry stage 33 has the moving block 34 to be movable in X- and Y-directions. The FIB column 3 and the optical alignment microscope 30 are fixed to the moving block 34. The differential pumping device 2 is integrally secured to a lower end of the FIB column 3. The structures of the FIB column 3 and the differential pumping device 2 are substantially identical with those in the process apparatus 1 in the first embodiment.

The FIB column 3 is connected to the vacuum pump 27. The moving block 34 is connected to the stage control power supply 35.

This embodiment, as described above, has the moving block 34 which is secured to the gantry stage 33 to be movable in the X- and Y-directions, thereby enabling the FIB column 3 and the optical alignment microscope 30 mounted on the moving block 34 to be moved without need to move the photomask 6. It is, therefore, possible to decrease the footprint of the process apparatus 1J.

Although each of the embodiments according to the present invention has been described, the present invention contributes to improvement in quality of processing conducted in the processing space Sp because a high-level vacuum in the processing space Sp is maintained without fail. Further, the precursor gas is discharged from the innermost annular groove 10A surrounding the orifice 11 within the process surface-facing surface 9A of the head 7, and so, thin film is formed on the photomask 6 without fail.

The present invention provides easy maintenance and reduces equipment cost and management cost because the groove-defining plate 9 is detachably attached to the head 7, and so, what is required is only replacement or cleaning of the groove-defining plate 9.

Other Embodiments

Although the embodiments of the present invention have been described, the description and drawings, which is a part of the disclosure of these embodiments, should not be understood to limit the present invention. From this disclosure, alternative embodiments, examples, and operational technology should be clear to a person skilled in the art.

In the foregoing embodiments, the number of the annular grooves formed in the differential pumping device is not limited to four, but however, at least two annular grooves: one being a gas discharge groove and the other being a gas ejecting groove, may be provided. Additionally, the annular grooves 10A, 10B, 10C, and 10D are circular in shape, but however, may alternatively be designed in any other shape, such as a square looped shape.

In the foregoing embodiments, the photomask 6 is used as a substrate to be processed, but the present invention is applicable to various kinds of display substrates that require processing for thin film formation following observation of wiring defects.

REFERENCE SIGNS

Ib Focused Ion Beam
Sp Space for Conducting Processing
1, 1A, 1B, 1C, 1D, 1E, 1F, 1G, 1H, 1I, 1J Process Apparatus
2 Differential Pumping Device
3 Focused Ion Beam Column (FIB Column)
4 Substrate Support
6 Photomask
6A Surface to be processed
7 Head
8 Head Body
8B Orifice
9 Groove-forming plate
9A Process surface-facing surface
9B Tapered Surface
9C Rounded Surface
9D, 9E, 9F, 9G, 9H Annular Plate
10A, 10B, 10C, 10D Annular Groove
11 Orifice
14 Chamber
15 Focused Ion Beam Optical System
16 Air float pad
17 Microchannel plate
17A Ion Beam Output Orifice
17B Detector
Optical Alignment Microscope
31 Optical Microscope
33 XY Gantry Stage

What is claimed is:

1. A process apparatus comprising:

a differential pumping device including a head which faces a given area of a process surface of a substrate to be processed and has a plurality of annular grooves formed in a process surface-facing surface of the head which faces the process surface of the substrate, the annular grooves surrounding a center of the head, the head having an orifice which is formed inside an innermost one of the annular grooves and defines a processing space serving to achieve processing of the process surface, at least one of the annular grooves being connected to a vacuum pump to suck gas from the one of the annular grooves with the process surface-facing surface opposed to the process surface to create a high-level vacuum in the processing space; and a focused ion beam column which is arranged on an opposite side of the head to the process surface-facing surface and includes a chamber leading to the orifice to be communicable with the processing space, the focused ion beam column also including a focused ion beam optical system which is disposed in the chamber and works to emit a focused ion beam through the orifice, wherein a precursor gas supply is connected to the innermost one of the annular grooves to eject a precursor gas toward the process surface so that the precursor gas flows into the processing space along the process surface.

2. The process apparatus according to claim 1, wherein the head includes a head body and a groove-forming plate attached to a surface of the head body which faces the substrate to be processed, and the surface of the groove-forming plate which faces the substrate to be processed is the process surface-facing surface.

3. The process apparatus according to claim 2, wherein the groove-forming plate is arranged in a form of islands within an outline of the surface of the head body which faces the substrate to be processed, and a shoulder of the head which is defined by the surface of the head body which faces the substrate and an outer periphery of the groove-forming plate is in a tapered shape.

4. The process apparatus according to claim 2, wherein the groove-forming plate is arranged in a form of islands within an outline of the surface of the head body which faces the substrate to be processed, and a shoulder of the head which is defined by the surface of the head body which faces the substrate and an outer periphery of the groove-forming plate is shaped to have a rounded surface.

5. The process apparatus according to claim 2, wherein the groove-forming plate includes a plurality of annular plates arranged around a center of the head.

6. The process apparatus according to claim 1, wherein a microchannel plate is disposed which has a beam output orifice which is formed in a nose of the chamber and through which the focused ion beam passes, and wherein the microchannel plate has a portion which lies around the beam output orifice and serves as a detector to capture secondary charged particles sputtered from the substrate.

7. The process apparatus according to claim 1, further comprising an optical microscope which detects an alignment mark formed on the substrate.

8. The process apparatus according to claim 1, further comprising an observation microscope which is arranged at a given offset-distance away from the head and works to observe a given region of the substrate to be processed.

9. The process apparatus according to claim 1, wherein the focused ion beam column includes a plurality of focused ion beam columns each of which has the differential pumping device mounted on a tip end thereof, each of the focused ion beam columns being arranged to face a respective one of a plurality of regions defined on the process surface of the substrate.

10. The process apparatus according to claim 1, wherein the focused ion beam column equipped with the differential pumping device is arranged to be movable in X-and Y-directions relative to the substrate which is fixed.

* * * * *